United States Patent
Walker et al.

(10) Patent No.: US 6,710,990 B2
(45) Date of Patent: Mar. 23, 2004

(54) LOW VOLTAGE BREAKDOWN ELEMENT FOR ESD TRIGGER DEVICE

(75) Inventors: John de Q. Walker, Colorado Springs, CO (US); Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 67 days.

(21) Appl. No.: 10/055,082

(22) Filed: Jan. 22, 2002

(65) Prior Publication Data

US 2003/0137789 A1 Jul. 24, 2003

(51) Int. Cl.[7] .................................................. H02H 9/04
(52) U.S. Cl. ......................................... 361/56; 361/111
(58) Field of Search .......................... 361/56, 54, 91.1, 361/111; 257/395

(56) References Cited

U.S. PATENT DOCUMENTS

| | | | | |
|---|---|---|---|---|
| 4,990,802 A | * | 2/1991 | Smooha | 307/482 |
| 5,043,782 A | * | 8/1991 | Avery | 357/23.13 |
| 5,140,401 A | * | 8/1992 | Ker et al. | 357/43 |
| 5,477,414 A | * | 12/1995 | Li et al. | 361/56 |
| 5,623,156 A | * | 4/1997 | Watt | 257/355 |
| 5,623,387 A | * | 4/1997 | Li et al. | 361/56 |

\* cited by examiner

*Primary Examiner*—Brian Sircus
*Assistant Examiner*—Zeev Kitov
(74) *Attorney, Agent, or Firm*—Carstens, Yee & Cahoon (57) ABSTRACT

As technology in the semiconductor industry advances, semiconductor devices decrease in size to become faster and less expensive per function. Smaller semiconductor devices, particularly MOSFETs, are increasingly sensitive to Electrostatic Discharge (ESD). ESD can either destroy or permanently damage a semiconductor device. Embodiments of the present invention assist in preventing ESD damage to semiconductor devices. An embodiment of the present invention utilizes a diode connected to the substrate terminal of a MOSFET. Under normal operation up to the maximum operating voltage, the diode and MOS devices are open and do not conduct. The diode triggers when an ESD pulse causes the reverse breakdown voltage of the diode to be exceeded. The resultant current switches a connected MOS device, operating in bipolar mode, to dissipate the damaging ESD pulse. The ESD pulse is shunted to ground, thereby avoiding damage to the rest of the device.

19 Claims, 14 Drawing Sheets

LOW VOLTAGE BREAKDOWN ELEMENT FOR ESD TRIGGER DEVICE

BACKGROUND OF THE INVENTION

1. Technical Field

This invention relates in general to electrostatic discharge (ESD) protection semiconductor devices, and more particularly to diodes and MOS transistors used to dissipate ESD pulses. Specifically, the present invention relates to a low breakdown voltage diode and MOSFET operating to dissipate ESD pulses.

2. Description of the Related Art

As technology in the semiconductor industry advances, semiconductor devices shrink in size according to Moore's law. Shrinkage of semiconductor devices is desirable as smaller semiconductor devices allow smaller electronic equipment, use less power, run faster and provide more function for the same price. However, smaller devices can also be more susceptible to damage caused by electrostatic discharge.

Semiconductor devices are formed of three types of materials: conductors, insulators, and semiconductors, the latter of which can be controlled to change from a conductor to an insulator under various conditions. As the main materials used for conductors and insulators are metals (e.g., aluminum and copper) and oxides (e.g. silicon dioxide), and as the transistors operate by inducing electric fields in the semiconductor, the technology is referred to as MOSFET, short for metal-oxide-semiconductor field effect transistor, even though other materials can be used (e.g. heavily doped silicon and metal silicides can be used as a conductor).

Figure 1A:
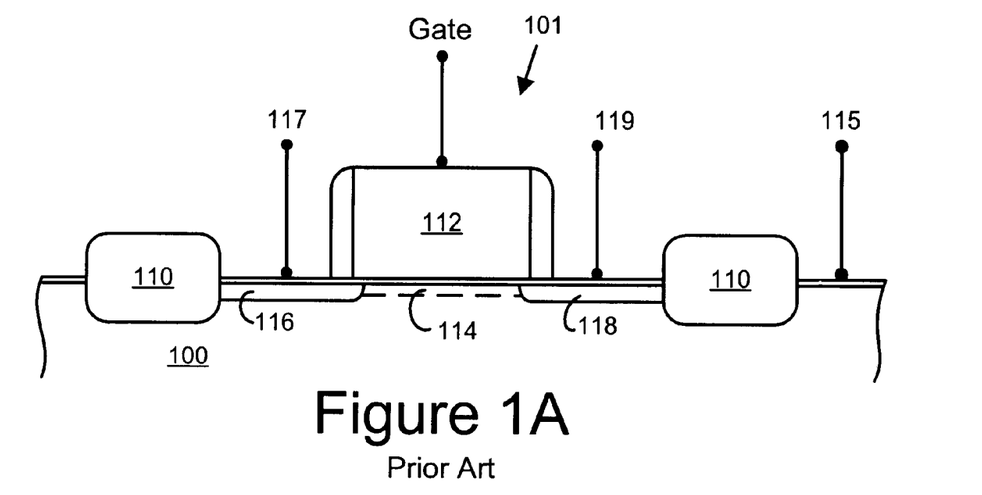
FIGS. 1A and 1B are simple schematics of a transistor and a diode, according to the prior art.

FIG. 1A shows a simple transistor 101 formed as a MOSFET device. Substrate 100 is a semiconductor that is formed of a conducting material having one of two types of polarity, either P-type or N-type. For purposes of this discussion, substrate 100 is a P-type substrate, although either type can be used. Regions 110 are non-conducting oxides that isolate this transistor from other transistors in the area. Regions 116 and 118 of substrate 100 are conductive regions with the opposite type of polarity, in this case, N-type. Generally one of regions 116 and 118 will be connected to a voltage source 117 and the other to a ground connection 119, forming drain and source connections. Because a portion of the p-type substrate intervenes between regions 116 and 118, a current cannot normally flow between these two regions. A gate 112 is constructed over the channel region 114 between source 116 and drain 118, but electrically isolated from this region. By applying a voltage within a given range to gate 112, an electric field is induced in channel region 114 immediately below gate 112, which inverts the channel doping polarity from P-type to N-type, allowing a current to flow between the source and drain. The voltage applied to gate 112 can be controlled so that the transistor acts like a switch to turn the current on or off between the source and drain. A fourth terminal 115 of the MOSFET can connect to the substrate 100, named the substrate or body connection. Circuits consist of thousands of these transistors, along with other semiconductor components. However, if a large enough voltage is applied to any of the gates, the gate insulation around the gate is destroyed and the necessary insulating properties of the MOS gate insulator are destroyed, causing the transistor to malfunction.

Figure 1B:
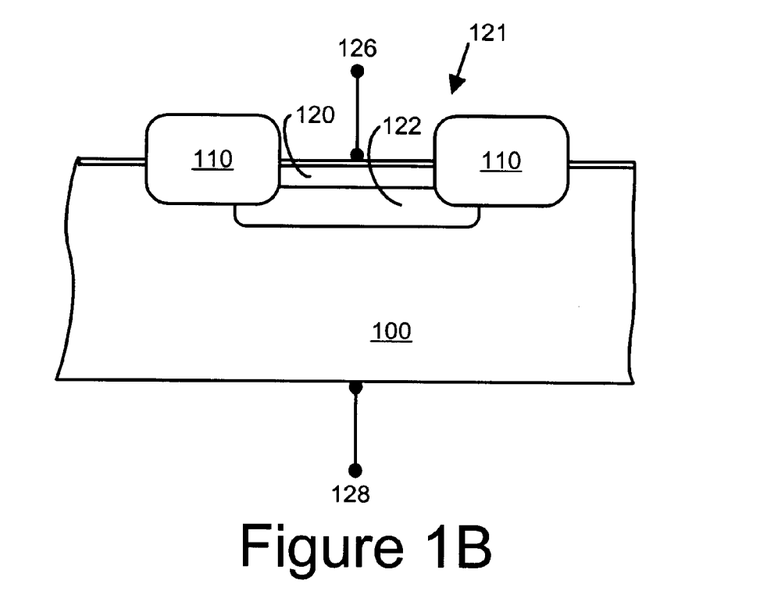

Diodes are another semiconductor device of interest. Rather than the five regions (gate, source, channel, drain and substrate) of a MOS transistor, a diode has only two regions (anode and cathode). FIG. 1B shows an example of a diode. Region 122 has the same type of polarity (e.g. P−) as substrate 100, only a stronger concentration (e.g., P+), while region 120 has the opposite polarity (e.g., N+). A diode normally conducts electricity in only one direction. A diode is forward biased and conducts if the p-type side of the device is biased positive with respect to the n-type side (e.g., terminal 128 is connected to a positive voltage source while terminal 126 is connected to a ground source. A diode is reverse biased and does not conduct if the n-type side is biased positive with respect to the p-type side (e.g., terminal 128 is connected to a ground source and terminal 126 is connected to a positive voltage source). In the reverse bias condition, if the voltage is above a given value, called the breakdown voltage, the diode will conduct current. The reverse bias breakdown current is non-destructive as long as the current level is low enough to avoid heating the semiconductor or associated metal connections to damaging temperatures Under the normal operating conditions of semiconductor devices, the currents and voltages that are established within the device are non-destructive. Under some conditions, the device can be exposed to very large voltages, generated by static electricity. When the device is subject to this static charge, the charge, known as an electrostatic discharge, or ESD, pulse, often finds a way to ground through the device. The high voltage can generate high currents for short periods of time. The high voltage is associated with a low charge; the voltage is not sustained and soon dissipates once it finds an easy path to ground. All semiconductor devices must be designed such that an ESD pulse does not damage the input, output, power, and ground devices. These components are designed so that the ESD protection devices will quickly recognize the ESD pulse and shunt the ESD pulse harmlessly to ground. If an ESD protection device is not available when the circuit is subject to an ESD pulse and once the pulse establishes the lowest resistance path to ground, high voltage levels will rupture and may cause permanent damage to the MOS gate oxides. High current paths will heat the silicon or metal conductors and cause permanent damage if they heat close to or above their respective melting points. In either mechanism, permanent device failure is likely to occur.

An integrated circuit requires a device that shunts an ESD pulse safely to a ground to prevent damage to its semiconductor devices. All ESD protection schemes work in this fashion.

Under normal high field operation of MOS devices, the field between the drain and channel can be high enough to create hole/electron pairs due to weak avalanche effects in the pinch-off region. The bias created by the holes can be enough to trigger parasitic bipolar conduction between drain and source. This parasitic conduction can also be induced by injecting any positive charge into the substrate of the MOS device. For this bipolar mechanism, the source, drain and substrate of the NMOS device operate as the collector, base and emitter of a lateral NPN bipolar device, and the injected charge is equivalent to the base current.

SUMMARY OF THE INVENTION

An electrostatic discharge circuit having an MOSFET and a diode is disclosed, along with the method of manufacturing the circuit. The diode and transistor are connected in parallel between a pad that normally carries an input or output signal and the grounded substrate, connected in such a manner that they cannot be turned on by the normal input or output signal voltage. However, whenever an electrostatic discharge event occurs, the voltage will exceed the reverse breakdown voltage of the diode. As breakdown current begins to flow through the diode into the substrate, the substrate of the MOS receives the potential necessary to turn the transistor on by parasitic NPN bipolar transistor action. The transistor will carry most of the current to ground, protecting the diode from overheating, while the tie to ground keeps the gate from receiving too high a potential and being destroyed. The electrostatic discharge is dissipated non-destructively. Once the ESD pulse has been discharged, both the diode and transistor return to their off state, ready for another ESD event.

BRIEF DESCRIPTION OF THE DRAWINGS

The novel features believed characteristic of the invention are set forth in the appended claims. The invention, however, as well as a preferred mode of use, further objects and advantages thereof, will best be understood by reference to the following detailed description of an illustrative embodiment when read in conjunction with the accompanying drawings, wherein:

FIGS. 7A1–7G4 show the process of manufacturing the disclosed device according to the four embodiments discussed.

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

All embodiments of this invention provide for a reverse bias diode triggering mechanism that turns on the parasitic bipolar elements of an MOS device to dissipate the energy of an ESD pulse. The three key elements of the design are 1) An ESD pulse triggers the breakdown of a reverse bias diode. 2) The breakdown voltage of the diode can be tailored by adjusting the concentration of the diode components 3) The resulting reverse breakdown current triggers parasitic bipolar conduction in a connected MOS device, which then turns on to dissipate the ESD pulse. The four embodiments describe different ways of adjusting the reverse breakdown voltage of the diode.

Figure 2:
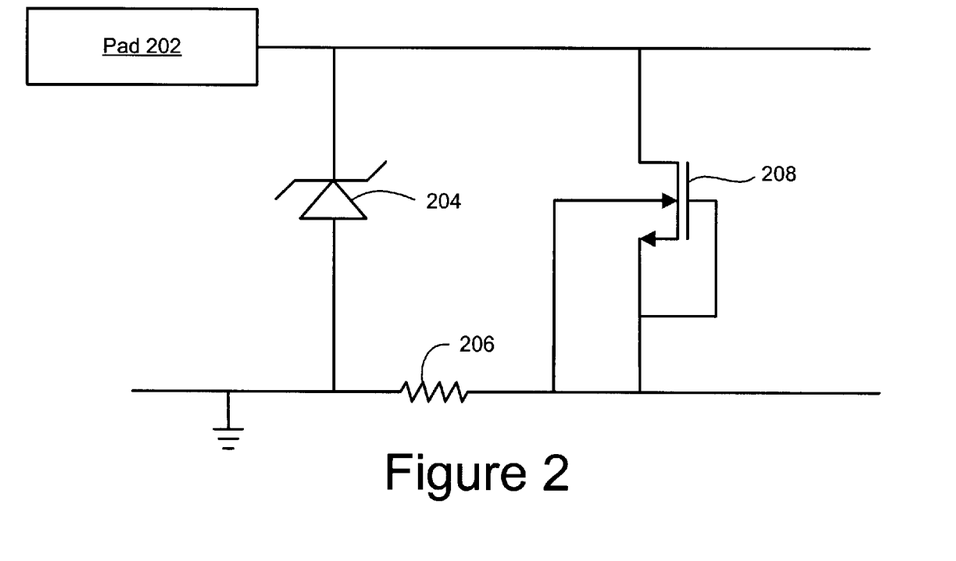
FIG. 2 is a schematic diagram of the ESD circuit according to a preferred embodiment.

FIG. 2 shows an equivocal circuit diagram of the broadly embodied invention. Electrostatic discharge (ESD) semiconductor device 200 is formed from semiconductor pad 202, zener diode 204, N-type metal-oxide-semiconductor field effect transistor (MOSFET) 208, and substrate resistor 206. Pad 202 is connected to provide an input or output voltage to the device, for example, 3.3V input/output voltage. Zener diode 204 has a cathode connected to pad 202 and an anode connected to ground, and is reverse biased under normal operating conditions. Ground is the 0V reference potential. N-type MOSFET 208 has a drain terminal connected to pad 202, a source terminal connected to a first conduction terminal of substrate resistor 206, and a gate terminal connected to the source terminal. Substrate resistor 206 has a second conduction terminal connected to ground.

An ESD pulse is often many kilo-volts. The ESD semiconductor protection device 200 operates normal input/output (I/O) voltage operating conditions, passing the I/O signal unperturbed to the rest of the device. This I/O voltage ranges from 1.0V up to 5.0V, depending on operation. Zener diode 204 is designed to trigger by reverse breakdown at a voltage that is greater than the maximum I/O voltage, plus an amount that accounts for the manufacturing variation of the zener diode reverse breakdown, for example 6 volts for a 5 volt I/O operating voltage. The size of the diode must be adjusted so that ESD induced current paths do not damage the diode by joule heating. The substrate resistor, 206, is not explicitly created, but is an artifact of the distributed resistive properties of the substrate. The distributed nature of the substrate resistance, 206, allows voltage levels other than the ground potential to exist in the substrate When a positive ESD pulse hits I/O pad 202, the potential of the zener diode exceeds the reverse bias breakdown voltage of the zener diode, 204, A positive current is injected into the substrate, via the substrate parasitic resistor, 206. This injected current causes parasitic bipolar action to occur in the NMOS device, 208, turning the NMOS device on and dissipating the ESD pulse from the pad, 202, to ground. The size of the MOS device must be adjusted so that ESD induced current paths do not damage the MOS device by joule heating. Once the ESD pulse has dissipated, the protection device returns to its original state, ready to protect again if hit by another ESD event.

It should be noted that complimentary semiconductor devices could be fashioned to perform essentially the same function. However, the complimentary semiconductor devices still fall within the realm of the embodied invention.

Figure 3:
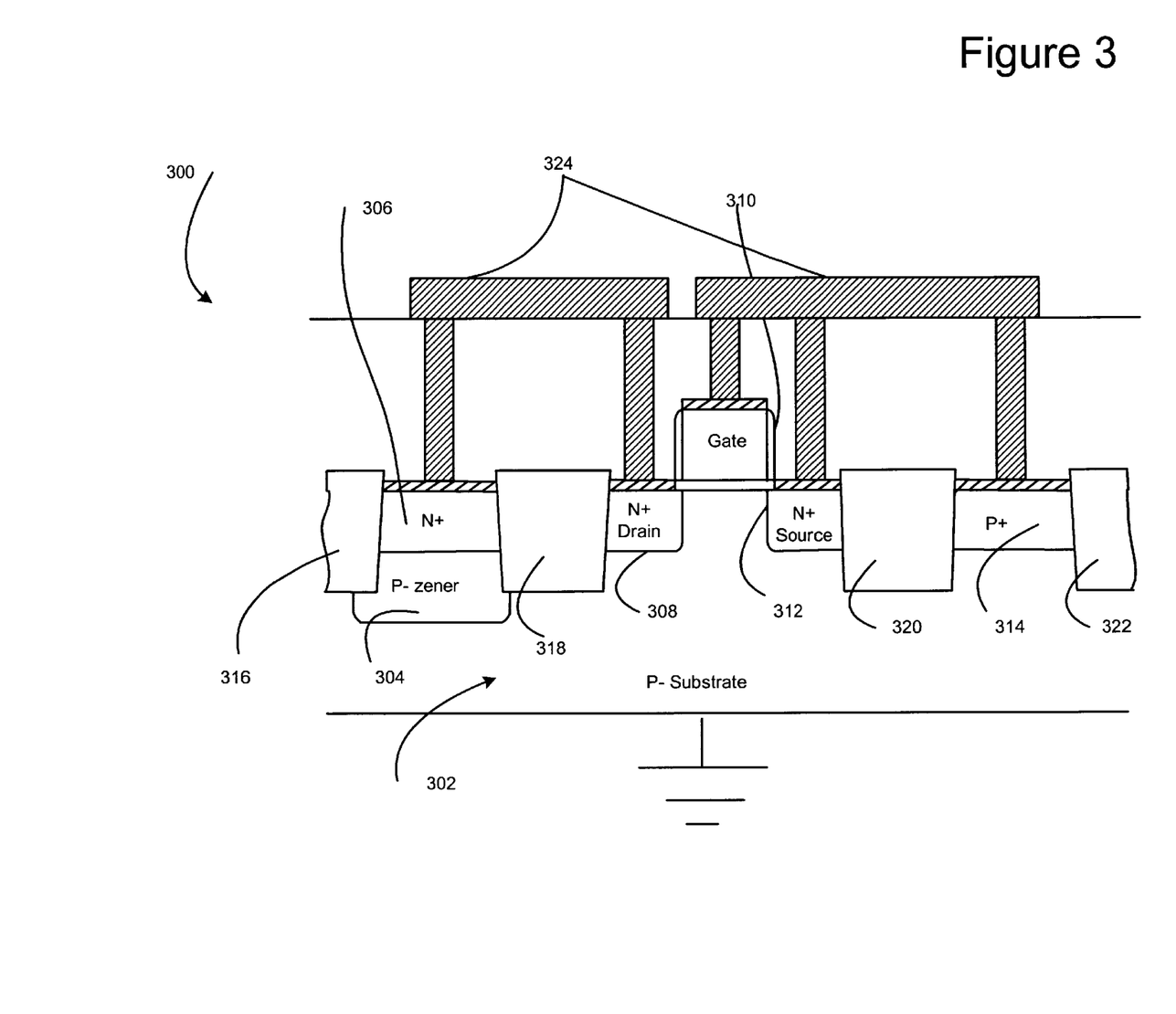
FIG. 3 is a view of the portions of the ESD semiconductor circuit of FIG. 2 that are implanted on a semiconductor substrate, according to a first embodiment of the invention.

FIG. 3 shows a partial cross-sectional view of a first embodiment of ESD semiconductor device. ESD semiconductor device 300 is formed on P$^-$-type substrate 302. P$^-$-type substrate 302 is connected to ground and has a first doping concentration. N$^+$-type regions 306, 308, 312, and P$^+$-type region 314 are implanted into P$^-$-type substrate 302. P$^-$-type region 304 is also implanted between N$^+$-type region 306 and P$^-$-type substrate 302, and has a second doping concentration that is greater than the first doping concentration of P$^-$-type substrate 302. P$^-$-type region 304 and N$^+$-type region 306 together form a NP-junction zener diode wherein the anode of the zener diode resides in P$^-$-type region 304 and the cathode of the zener diode resides in N⁺-type region 306. The cathode is coupled to pad 324 for receiving a voltage such as that from an ESD pulse, whereas the anode is coupled to P⁻-type substrate 302 and thus to receive the ground potential. The junction formed in the zener diode approximates the abrupt case. Breakdown voltages of abrupt junctions can be approximated by the equation $$V_b = 60*(E_g/1.1)^{3/2}*(N_b/10^{16})^{-3/4}, \quad \text{(Equation 1)}$$

where $V_b$ is the breakdown voltage for the diode, $E_g$ is the energy band gap of the semiconductor material that forms the diode, and $N_b$ is the concentration of the material low doped side of the junction. Equation 1 thereby illustrates a method of lowering the breakdown voltage by varying material and doping concentrations of the materials. The zener diode can be triggered at a predetermined reverse bias breakdown voltage by adjusting the concentration of the P type region, 304. The predetermined voltage is therefore chosen well below that of an ESD pulse, but at a voltage that is above the maximum operating voltage of the I/O pad, plus an additional voltage to accommodate the manufacturing variation of the zener diode reverse breakdown voltage.

Gate terminal 310 is formed above a region that separates N⁺-type region 308 and N⁺-type region 312. Gate terminal 310, N⁺-type region 308, and N⁺-type region 312 form an N-type MOSFET device, wherein N⁺-type region 308 is the drain terminal of the N-type MOSFET and N⁺-type region 312 is the source terminal of the N-type MOSFET device. A channel region of the N-type MOSFET is formed from a separation of N⁺-type region 308 and N⁺-type region 312. The channel region conducts current through the N-type MOSFET device. The source terminal formed by N⁺-type region 312 and gate terminal 310 are coupled to P⁺-type region 314. P⁺-type region 314 forms a substrate contact. The substrate resistor formed by P⁺-type region 314 is then connected to ground through P⁻-type substrate 302. The geometry between P+region substrate contact 314 and the MOS substrate forms a substrate resistor in region 302. The drain formed by N⁺-type region 308 is coupled to pad 324 for receiving a voltage such as that from an ESD pulse.

The zener diode formed by P⁻-type region 304 and N⁺-type region 306 is separated from the N-type MOSFET device formed by gate terminal 310, N⁺-type region 308, and N⁺-type region 312. The separation is illustrated as isolation region 318. Isolation region 320 separates the source of the N-type MOSFET formed by N⁺-type region 312 and the substrate contact formed by P⁺-type region 314. Isolation region 316 and isolation region 322 separate ESD semiconductor device 300 from other devices within an integrated circuit.

Figure 4:
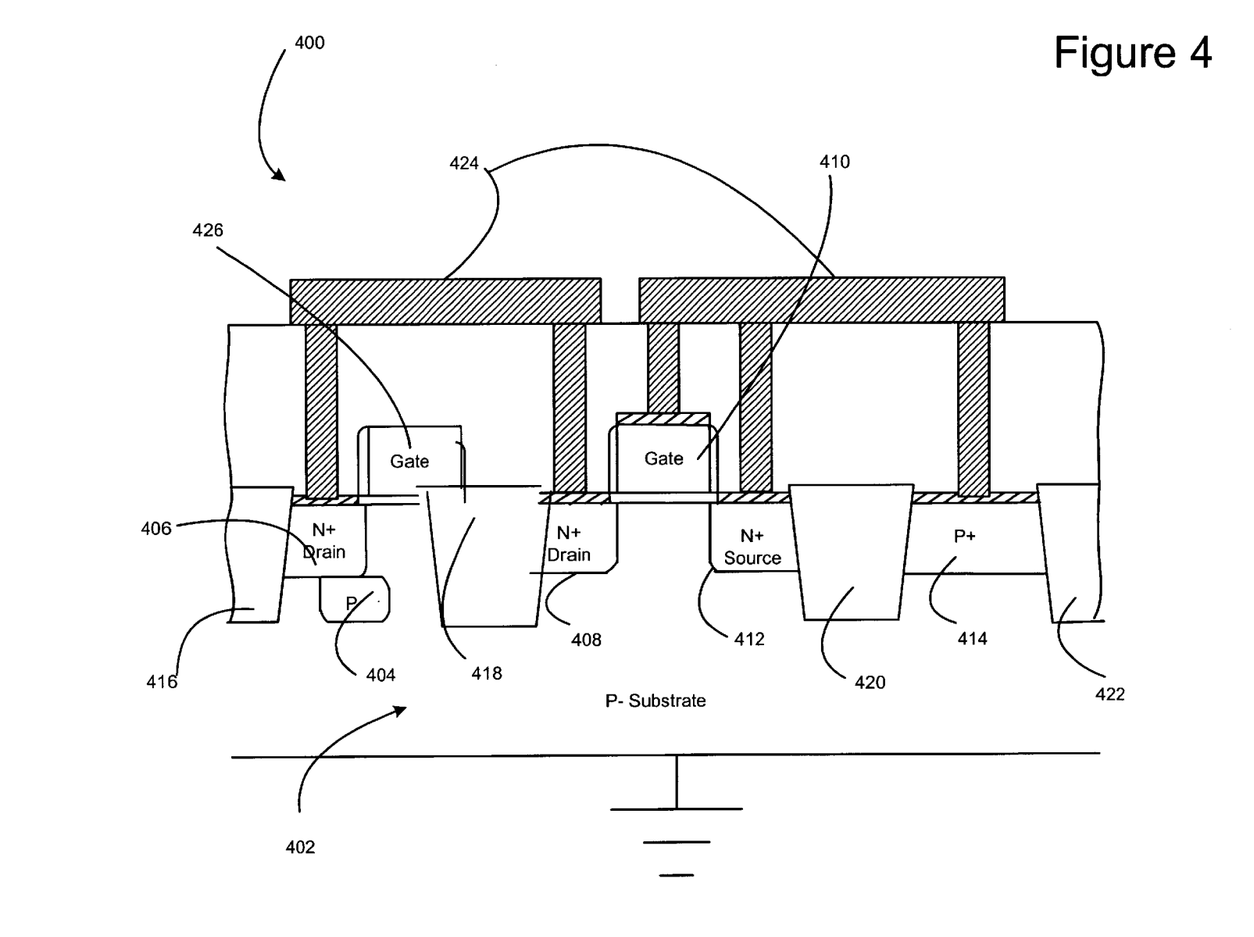
FIG. 4 is a view of the portions of the ESD semiconductor circuit of FIG. 2 that are implanted on a semiconductor substrate, according to a second embodiment of the invention.

FIG. 4 shows a partial cross-sectional view of a second embodiment of the ESD semiconductor device. ESD semiconductor device 400 is formed on P⁻-type substrate 402. P⁻-type substrate 402 is connected to ground and has a first doping concentration. N⁺-type regions 406, 408, 412, and P⁺-type region 414 are implanted into P⁻-type substrate 402. P-type halo region 404 is also implanted between N⁺-type region 406 and P⁻-type substrate 402, and has the first doping concentration of P⁻-type substrate 402. Gate terminal 426 is formed above a region that separates N⁺-type region 406 from isolation region 418. Gate terminal 426 overlaps onto isolation region 418. P⁻-type substrate 402 and N⁺-type region 406, in combination with gate terminal 426, form a diode, the gate 426, is present to ensure the halo implant 404, ends up at the correct location. The breakdown voltage of the MOS diode is decreased with the implantation of P-type halo region 404. The implantation of P-type halo region 404 is also used on other, functional NMOS devices (not shown) within the circuit to improves the MOS channel length control by restricting a depletion spread of the N⁺-type region 408 implant and the N⁺-type region 412 implant.

Gate terminal 410 is formed above a region that separates N⁺-type region 408 and N⁺-type region 412. Gate terminal 410, N⁺-type region 408, and N⁺-type region 412 form a N-type MOSFET device, wherein N⁺-type region 408 is the drain terminal of the N-type MOSFET and N⁺-type region 412 is the source terminal of the N-type MOSFET device. A channel region of the N-type MOSFET is formed from a separation of N⁺-type region 408 and N⁺-type region 412. The channel region conducts current through the N-type MOSFET device. The source terminal formed by N⁺-type region 412 and gate terminal 410 are coupled to P⁺-type region 414. P⁺-type region 414 forms a substrate contact. The substrate resistor formed by P-type region 402 is then connected to ground. The drain formed by N⁺-type region 408 is connected to pad 424 for receiving a voltage such as that from an ESD pulse.

Gate terminal 426, is present as an artifact to achieve the placement of the halo region, 404. The diode formed by P⁻-type substrate 402, N⁺-type region 406, and P-type halo region 404 is separated from the N-type MOSFET device formed by gate terminal 410, N⁺-type region 408, and N⁺-type region 412. The separation is illustrated as isolation region 418. Isolation region 420 separates the source of the N-type MOSFET formed by N⁺-type region 412 and the substrate resistor formed by P⁺-type region 414. Isolation region 416 and isolation region 422 separate ESD semiconductor device 400 from other devices in an integrated circuit.

Figure 5:
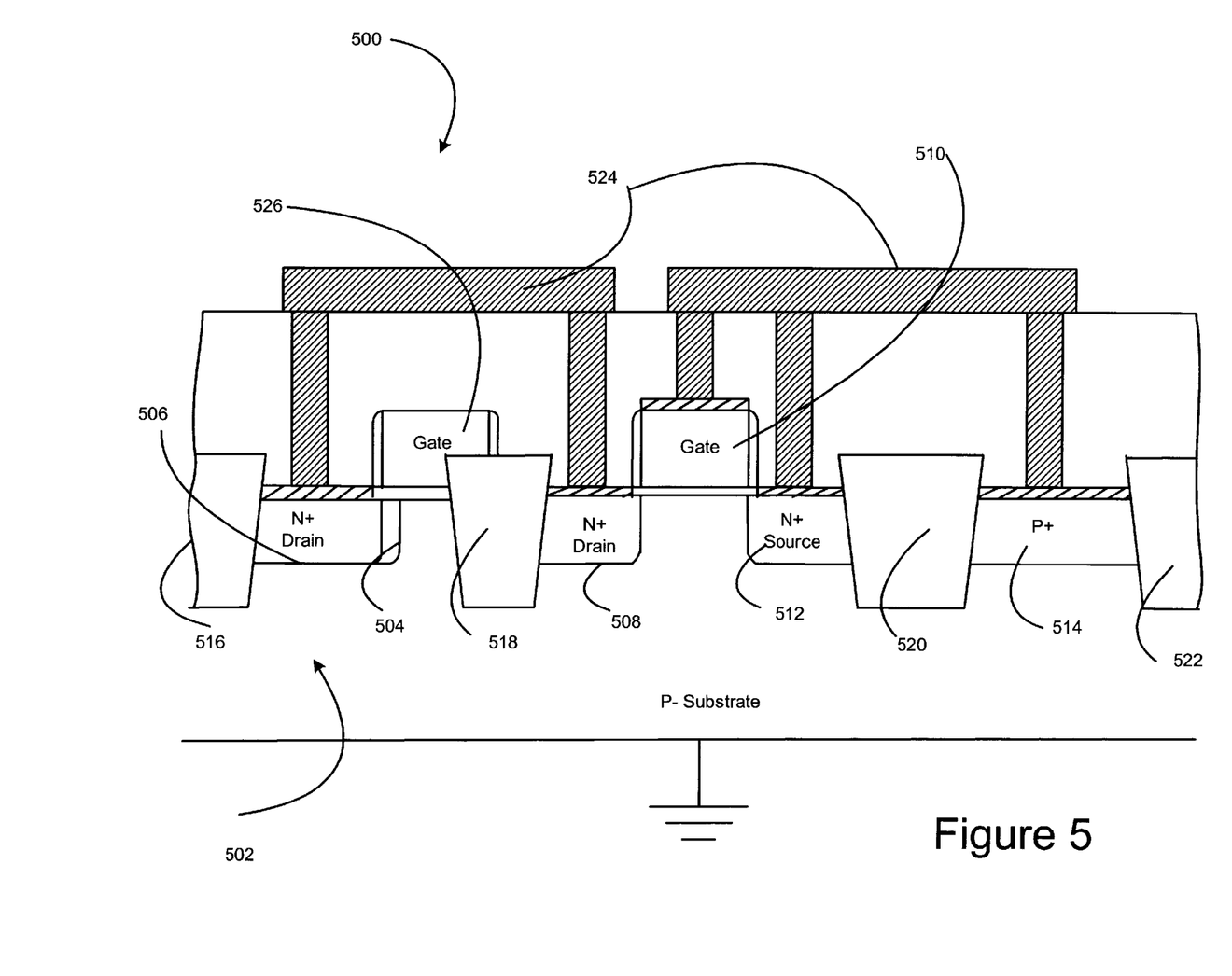
FIG. 5 is a view of the portions of the ESD semiconductor circuit of FIG. 2 that are implanted on a semiconductor substrate, according to a second embodiment of the invention.

FIG. 5 shows a partial cross-sectional view of a third embodiment of the ESD semiconductor device. ESD semiconductor device 500 is formed on P⁻-type substrate 502. P⁻-type substrate 502 is connected to ground and has a first doping concentration. N⁺-type regions 506, 508, 512, and P⁺-type region 514 are implanted into P⁻-type substrate 502. P-type Lightly Doped Drain (LDD) 504 is also implanted adjacent to N⁺-type region 506, and is separated from isolation region 518 by P⁻-type substrate 502. P-type LDD 504 has a second doping concentration that is opposite to the first doping concentration of P⁻-type substrate 502. Gate terminal 526 is formed above a region that separates N⁺-type region 506 and P-type LDD 504 from isolation region 518. Gate terminal 526 is coupled, or "tied off", to isolation region 518. P⁻-type substrate 502 and N⁺-type region 506, form a diode. Gate terminal 526, is present as an artifact to achieve the placement of the PLDD region, 504. The reverse breakdown voltage of the MOS diode is decreased with the implantation of P-type LDD 504 having the second doping concentration.

Gate terminal 510 is formed above a region that separates N⁺-type region 508 and N⁺-type region 512. Gate terminal 510, N⁺-type region 508, and N⁺-type region 512 form a N-type MOSFET device, wherein N⁺-type region 508 is the drain terminal of the N-type MOSFET and N⁺-type region 512 is the source terminal of the N-type MOSFET device. A channel region of the N-type MOSFET is formed from a separation of N⁺-type region 508 and N⁺-type region 512. The channel region conducts current through the N-type MOSFET device. The source terminal formed by N⁺-type region 512 and gate terminal 510 are connected to P⁺-type region 514. P⁺-type region 514 forms a substrate contact. The substrate contact formed by P⁺-type region 514 is then connected to ground through P⁻-type substrate 502. The drain formed by N⁺-type region 508 is connected to pad 524 for receiving a voltage such as that from an ESD pulse.

The diode formed by P⁻-type substrate 502, N⁺-type region 506, and P-type LDD 504 is separated from the N-type MOSFET device by isolation region 518. Isolation region 520 separates the source of the N-type MOSFET formed by N⁺-type region 512 and the substrate contact formed by P⁺-type region 514. Isolation region 516 and isolation region 522 separate ESD semiconductor device 500 from other devices in an integrated circuit.

Figure 6:
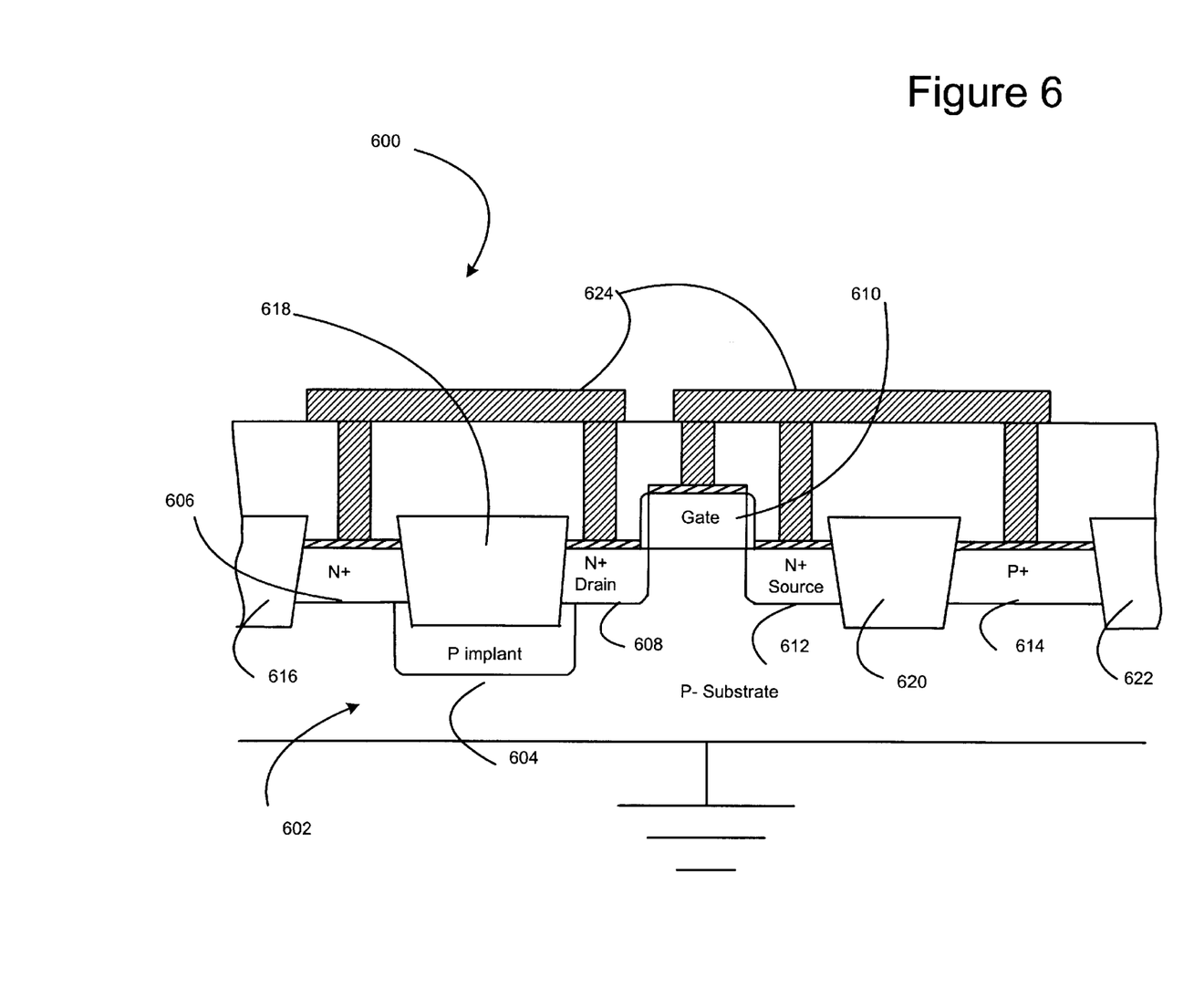
FIG. 6 is a view of the portions of the ESD semiconductor circuit of FIG. 2 that are implanted on a semiconductor substrate, according to a third embodiment of the invention.

FIG. 6 shows a partial cross-sectional view of a fourth embodiment of the ESD semiconductor device. ESD semiconductor device 600 is formed on P⁻-type substrate 602. P⁻-type substrate 602 is connected to ground and has a first doping concentration. N⁺-type regions 606, 608, 612, and P⁺-type region 614 are implanted into P⁻-type substrate 602. P-type implant 604 is also implanted below N⁺-type region 606 and N⁺-type region 608. P-type implant 604 has the first doping concentration of P⁻-type substrate 602. P-type implant 604 forms a region that reduces an N+ to P under field breakdown.

Gate terminal 610 is formed above a region that separates N⁺-type region 608 and N⁺-type region 612. Gate terminal 610, N⁺-type region 608, and N⁺-type region 612 form an N-type MOSFET device, wherein N⁺-type region 608 is the drain terminal of the N-type MOSFET and N⁺-type region 612 is the source terminal of the N-type MOSFET device. A channel region of the N-type MOSFET is formed from the region that separates N⁺-type region 608 and N⁺-type region 612. The channel region conducts current through the N-type MOSFET device. The source terminal formed by N⁺-type region 612 and gate terminal 610 are coupled to P⁺-type region 614. P⁺-type region 614 forms a substrate resistor. The substrate contact formed by P⁺-type region 614 is then connected to ground through P⁻-type substrate 602. The drain formed by N⁺-type region 608 is coupled to pad 624 for receiving a voltage such as that from an ESD pulse.

N⁺-type region 606 is separated from the N-type MOSFET device formed by gate terminal 610, N⁺-type region 608, and N⁺-type region 612. The separation is illustrated as isolation region 618. Isolation region 620 separates the source of the N-type MOSFET formed by N⁺-type region 612 and the substrate contact formed by P⁺-type region 614. Isolation region 616 and isolation region 622 separate ESD semiconductor device 600 from other devices in an integrated circuit.

DETAILED DESCRIPTION OF THE MANUFACTURING PROCESS

The embodiments as shown in FIG. 3, FIG. 4, FIG. 5, and FIG. 6 are similarly manufactured, with variations for their somewhat different features.

Figure 7A:
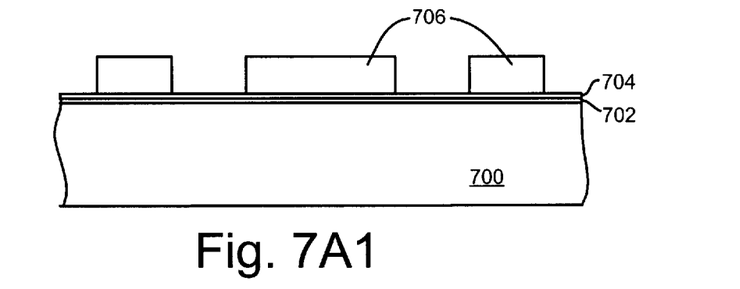
Figure 7A:
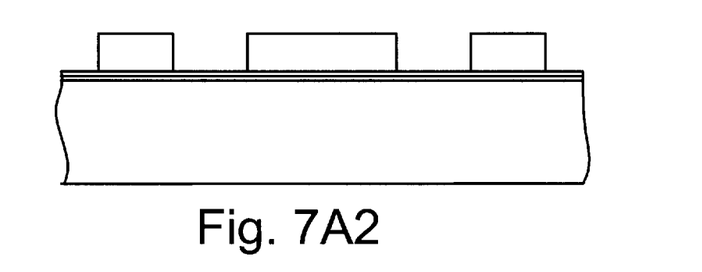
Figure 7A:
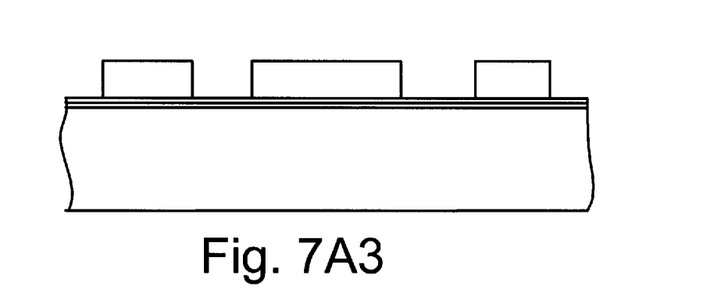
Figure 7A:
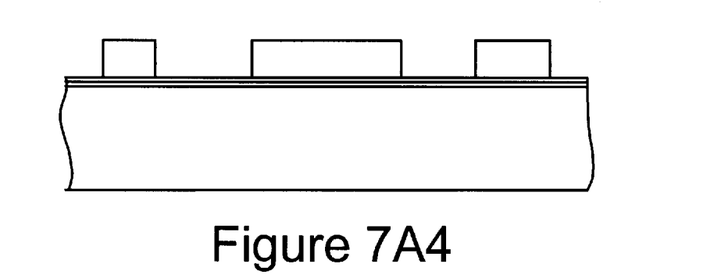
Figure 7B:
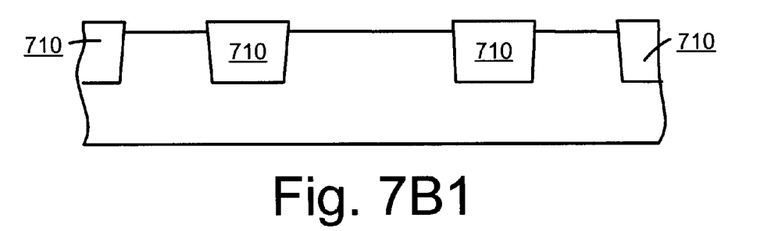
Figure 7B:
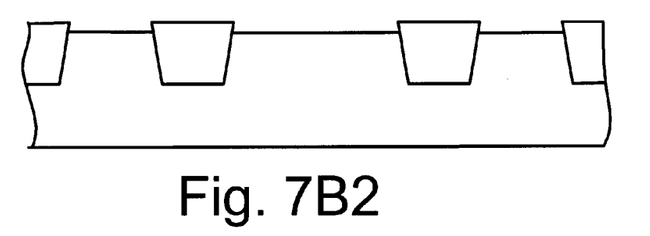
Figure 7B:
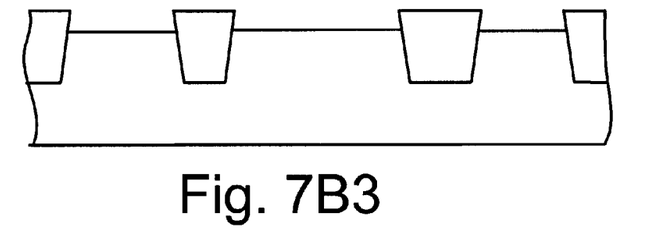
Figure 7B:
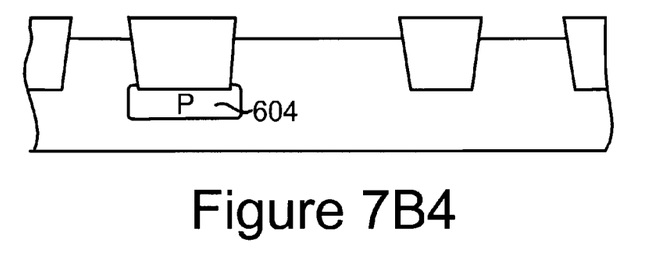
Figure 7C:
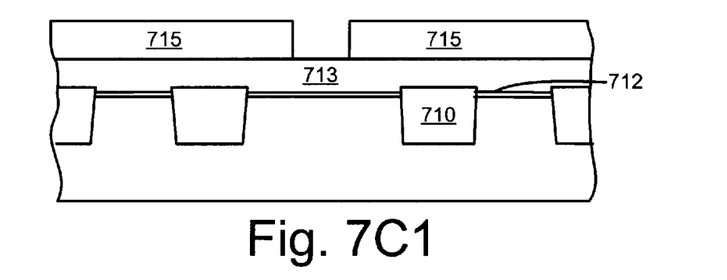
Figure 7C:
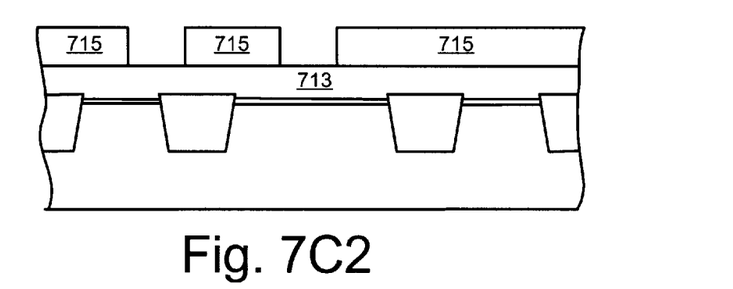
Figure 7C:
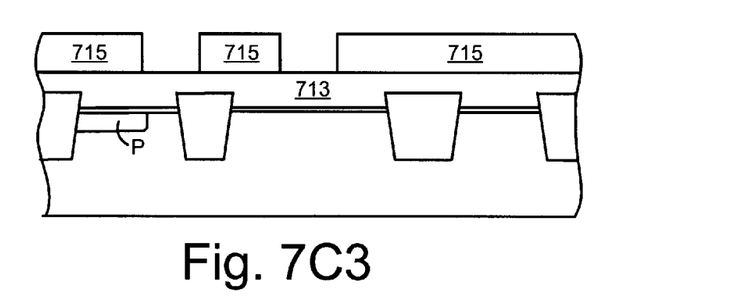
Figure 7C:
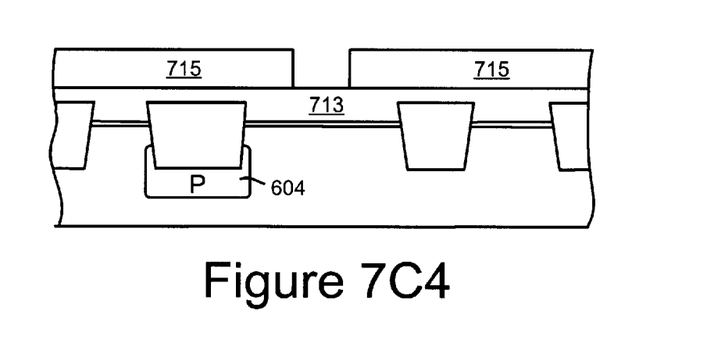
Figure 7D:
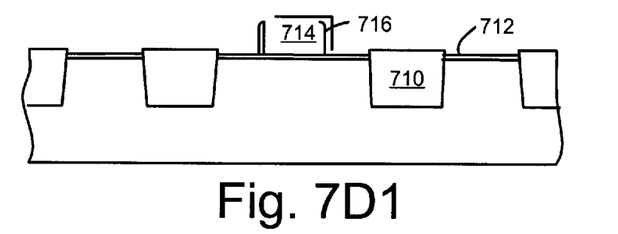
Figure 7D:
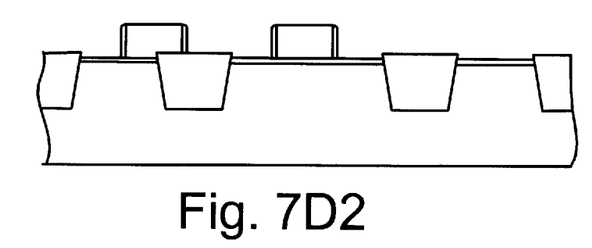
Figure 7D:
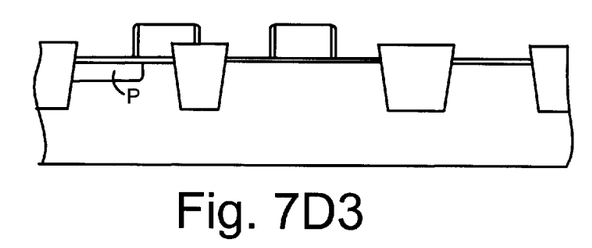
Figure 7D:
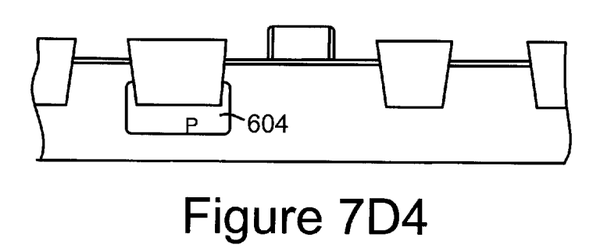
Figure 7E:
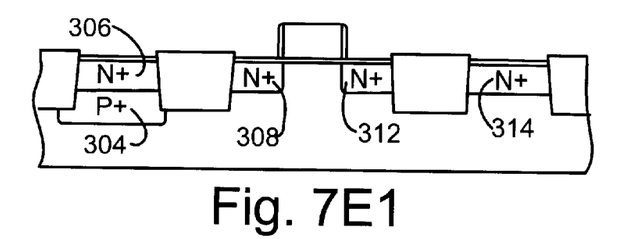
Figure 7E:
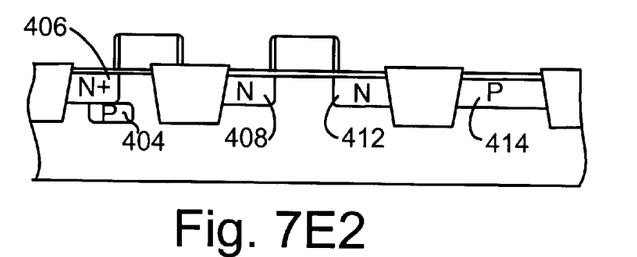
Figure 7E:
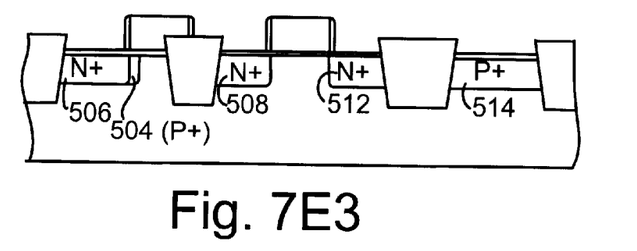
Figure 7E:
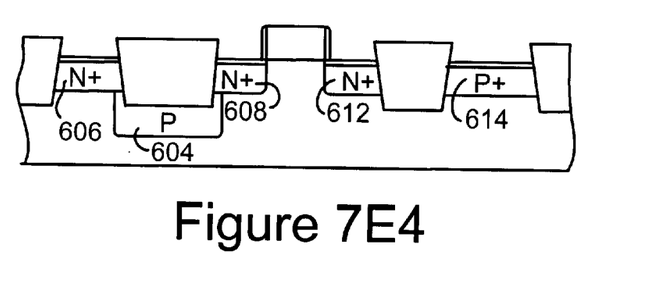
Figure 7F:
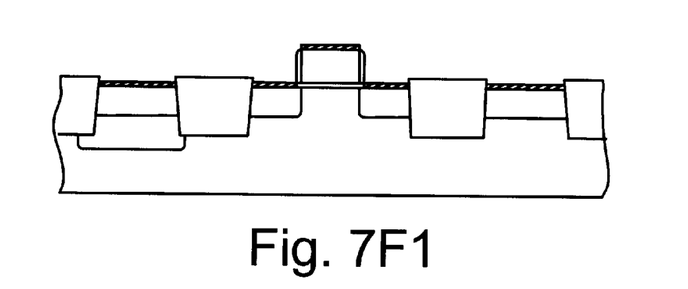
Figure 7F:
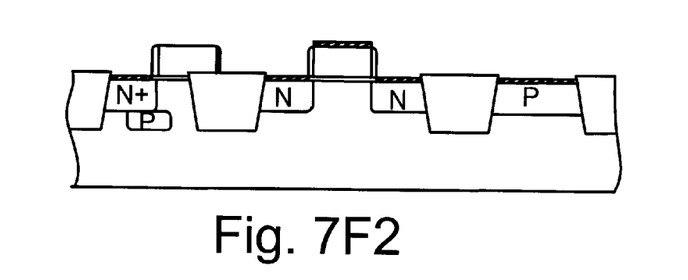
Figure 7F:
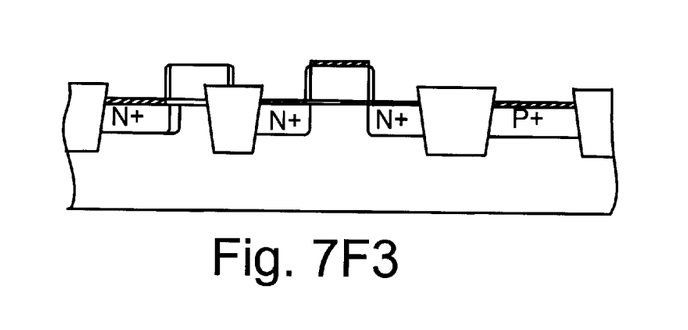
Figure 7F:
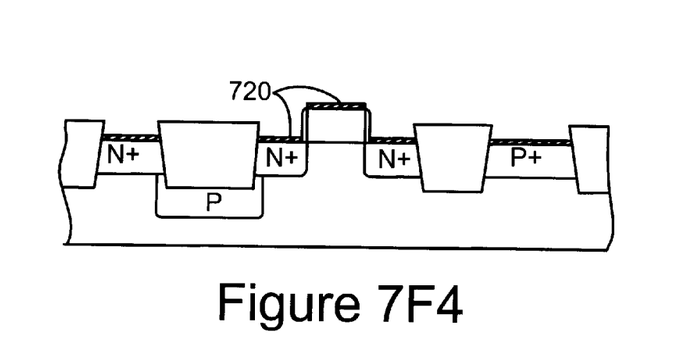
Figure 7G:
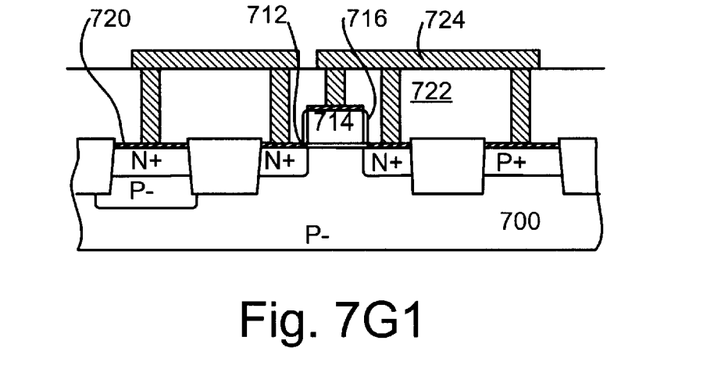
Figure 7G:
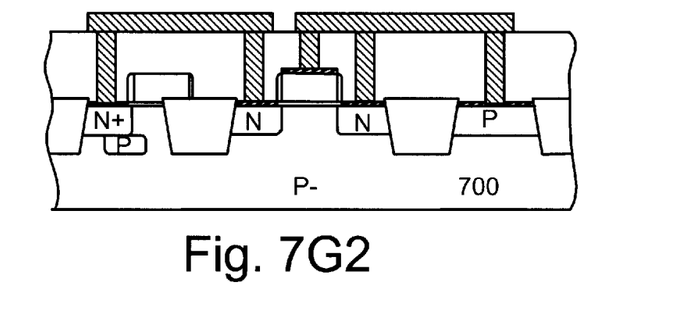
Figure 7G:
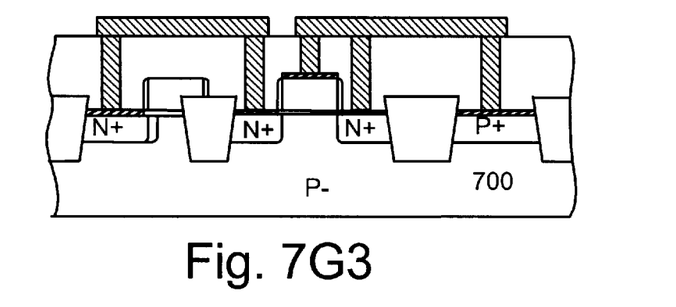
Figure 7G:
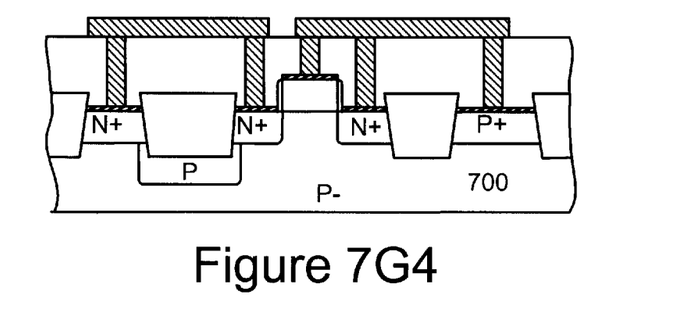

With reference now to FIGS. 7A1–7G4, the manufacturing process will now be discussed. Note that the drawings represent each of the four embodiments at different stages in their manufacture. All figures with the same letter (A–G) are at the same stage of manufacture. All figures having the same ending number (1–4) are the same embodiment. Where features are the same, such as isolation trenches, the reference numerals are the same, but where features are different, the figures are labeled as they were in FIGS. 3–6. In FIG. 7A(1–4), a thin pad oxide 702 is grown on substrate 700, then a nitride layer 704 is deposited over pad oxide 702. A photo-resist layer 706 is deposited and patterned. Isolation trenches are then etched into substrate 700 and the photo-resist layer 706 is removed. In all embodiments, oxide 710 is deposited into the trenches, with excess removed by chemical-mechanical polishing (CMP). Finally, the oxide 702 and nitride 704 layers are removed, giving the views seen in FIG. 7B(1–4). Other isolation methods could also be used for this step. For the embodiment of FIG. 6 only, a second photo-resist layer is deposited and patterned, a P-type implant performed to form region 604, and the second photo-resist is removed. The nitride and pad oxide are then removed.

A gate oxide 712 is next grown on substrate 700, then a polysilicon layer 713 is deposited. A photo-resist layer 715 is deposited and patterned according to the specific embodiment, as seen in FIG. 7C(1–4). In some "System on a chip" technologies, dual or triple gate oxide schemes are used to support different power supplies on the same device. In this case, the MOS device built for ESD protection would be built from the thickest gate oxide available.

Polysilicon layer 713 is etched to form the gates 714. For the embodiment of FIG. 5 only, photo-resist layer (not shown) is deposited, patterned and etched, then a P-type lightly doped drain (LDD) is implanted into the open area, which will later form region 504. This region will also be used on other functioning PMOS devices elsewhere in the circuit. All embodiments then have a layer of oxide deposited and globally etched to form gate spacers 716, giving the view shown in FIG. 7D(104).

The various embodiments next receive their appropriate implants, with separate depositions of photo-resist and appropriate patterning for N-type and P-type dopants to give the views seen in FIG. 7E(104). The separate masking and implantation steps are not shown for the individual embodiments, but are well known to one of ordinary skill in the art. Notably, both the embodiments of FIGS. 7E1 and 7E2 receive deep P-type implants to form either region 304 or halo region 404, then have N-type dopants implanted over the deep P regions to form their respective diodes. Halo region 404 will also be used on other functioning NMOS devices elsewhere in the circuit.

With the transistors themselves complete, contacts and wiring are formed next. Oxide is deposited and etched on the device for masking silicon and polysilicon regions that are not intended to be silicided. Silicide 720 is then formed on exposed silicon and polysilicon regions, as shown in FIG. 7F(1–4).

Finally, a thick insulating layer 722, such as silicon dioxide, is deposited. Photo-resist, patterning, and etching are used to form openings to the silicided contacts 720 on the transistor and diode. Metal, typically tungsten, is deposited into the openings, then a layer of metal, typically aluminum, is deposited over the oxide and patterned to form the desired metal connectors 724 to connect transistors and passive components, as seen in FIG. 7G(1–4). Alternatively, damascene processes, well known in the field of semiconductor manufacture, are used to create copper wiring.

This inventive ESD device can be used in CMOS technology with device sizes ranging from 0.5μ to 50 nm. Within this range, typical layers can have the thickness shown:

| | |
|---|---|
| Shallow Trench Isolation: | 0.1 to 0.35 μm |
| Polysilicon | 0.05 to 0.3 μm |
| P+, N+ junctions | 0.05 to 0.3 μm |
| Insulating dielectric | 0.25 to 1 μm |
| Metal | 0.4–1.0 μm |

Figure 8:
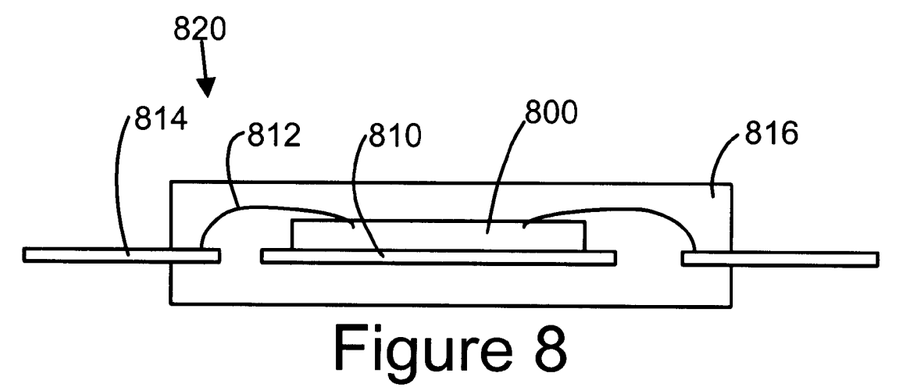
FIG. 8 shows schematically a packaged chip that can contain the disclosed device, according to an embodiment of the invention.

Once the process above is completed, there will still be other steps to complete the wafer, following which the chips will be separated, tested and mounted for use, as is well known in the art. FIG. 8 shows a completed chip 800 which has been and bonded to a frame 810. Wire connections 812 have been formed to portions of the frame that have become leads 814 to the external world. Finally, the chip is enclosed in plastic 816 to form package 820. Later leads 814 will be bent to shape. Alternatively, other packaging methods can be used.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. An electro-static discharge device having connections to a pad and a substrate, said electro-static discharge device comprising:
    a diode coupled for providing a bias signal, having a cathode coupled to said pad and an anode coupled to said substrate; and
    a transistor operating in response to said bias signal, said transistor having a drain terminal coupled to said pad, a source terminal coupled to said substrate, and a gate terminal coupled to said substrate and to said source terminal.

2. The electro-static discharge device of claim 1, further comprising a substrate resistor having a first conduction terminal coupled to said gate terminal of said transistor and said source terminal of said transistor, and a second conduction terminal coupled to said substrate.

3. The electro-static discharge device of claim 1, wherein the substrate is coupled to receive a ground reference potential and comprises a material having a first conductivity type and a first doping concentration, and the anode of the diode comprises a material having the first conductivity type and a second doping concentration that is greater than the first doping concentration.

4. The electro-static discharge device of claim 3, wherein the drain of the transistor, the source of the transistor, and the cathode of the diode comprise a material with a second conductivity type that is opposite in polarity to the first conductivity type.

5. The electro-static discharge device of claim 1, wherein the diode comprises a MOS diode coupled for providing the bias signal to the gate terminal of the transistor in response to a pad voltage that is greater than an operating voltage.

6. The electro-static discharge device of claim 1, wherein the diode comprises a zener diode coupled for providing a bias signal to the gate terminal of the transistor in response to a pad voltage that is greater than an operating voltage.

7. The electro-static discharge device of claim 1, wherein the transistor, operating in response to the bias signal from the diode, is coupled for conducting a current from the pad to the substrate.

8. The electro-static discharge device of claim 1, wherein said transistor is a MOSFET.

9. A semiconductor device having a pad and a substrate, comprising:
    a diode coupled for providing a bias signal, said diode having a first conduction terminal coupled to said pad and a second conduction terminal coupled to said substrate,
    a transistor operating in response to said bias signal, said transistor having a first conduction terminal coupled to said pad, a second conduction terminal coupled to said substrate and a control terminal coupled to said second conduction terminal an d to said substrate.

10. The semiconductor device of claim 9, further comprises a substrate resistor having a first conduction terminal coupled to said control terminal of said transistor and said second conduction terminal of said transistor, and a second conduction terminal coupled to said substrate.

11. The semiconductor device of claim 9, wherein said transistor, operating in response to said bias signal from said diode, is coupled for conducting a current from said pad to said substrate.

12. The semiconductor device of claim 11, wherein said transistor comprises a Metal Oxide Semiconductor field effect transistor having a gate terminal coupled for receiving said bias signal.

13. The semiconductor device of claim 11, wherein said transistor is an N-type MOSFET.

14. The semiconductor device of claim 9, wherein said diode comprises a zener diode coupled for providing said bias signal to said control terminal of said transistor in response to a pad voltage that is greater than an operating voltage.

15. The semiconductor device of claim 9, wherein said diode comprises an MOS diode coupled for providing said bias signal to said control terminal of said transistor in response to a pad voltage that is greater than an operating voltage.

16. A semiconductor chip package comprising
    a semiconductor chip having a substrate thereof electrically tied to ground; and
    an electrical connector configured to carry a supply voltage to said semiconductor chip;
    wherein said semiconductor chip contains an electrostatic discharge device comprises
        a diode coupled for providing a bias signal, said diode having a first conduction terminal coupled to said electrical connector and a second conduction terminal coupled to said substrate; and
        a transistor operating in response to said bias signal, said transistor having a first conduction terminal coupled to said electric connector, a second conduction terminal coupled to said substrate, and a control terminal coupled to said second conduction terminal and to said substrate.

17. A method of protecting a semiconductor device, comprising:
    detecting a first signal that is greater than a second signal; and
    conducting said first signal into a substrate that is coupled to receive a ground reference potential upon detecting said first signal.

18. The method of claim 17, wherein detecting said first signal comprises:
    conducting a current of said first signal through a diode; and
    providing a control signal to a control terminal of a transistor in response to conducting said current.

19. The method of claim 17, wherein conducting said first signal comprises:
    receiving a control signal at a control terminal of a transistor; and
    converting said first signal into a current with a substrate resistor that is coupled to the substrate, thereby conducting the first signal into the substrate.

* * * * *